United States Patent
Robb

Patent Number: 5,467,047
Date of Patent: Nov. 14, 1995

[54] POWER TRANSISTOR RAPID TURN OFF CIRCUIT FOR SAVING POWER

[75] Inventor: Stephen P. Robb, Tempe, Ariz.

[73] Assignee: Motorola, Inc., Schaumburg, Ill.

[21] Appl. No.: 275,551

[22] Filed: Jul. 15, 1994

[51] Int. Cl.⁶ .................... H03K 17/04; H03K 17/687
[52] U.S. Cl. ................. 327/377; 327/427; 327/108
[58] Field of Search ................. 323/289; 327/427, 327/432, 374, 377, 109, 108

[56] References Cited

U.S. PATENT DOCUMENTS

| | | | |
|---|---|---|---|
| 4,481,434 | 11/1984 | Janutka | 327/377 |
| 4,492,883 | 1/1985 | Janutka | 327/377 |
| 4,677,324 | 6/1987 | Ronan, Jr. et al. | 327/377 |
| 4,777,387 | 10/1988 | Collins | 327/109 |
| 5,281,862 | 1/1994 | Ma | 327/432 |
| 5,371,418 | 12/1994 | Leipold et al. | 327/109 |

Primary Examiner—Timothy P. Callahan
Assistant Examiner—Terry L. Englund
Attorney, Agent, or Firm—Gary W. Hoshizaki

[57] ABSTRACT

An integrated turn-off circuit rapidly turns off a power transistor (14) which saves power by reducing the power dissipated while the power transistor transitions from an on-state to an off state. During an enable cycle a first coupling circuit (19) couples an enabling signal to a gate of a power transistor (14). The enabling signal charges an input capacitance to a voltage that enables the power transistor (14). A first transistor (21) for discharging the input capacitance is disabled by a second transistor (23) during the enable cycle. During a disable cycle the first coupling circuit (19) decouples the gate of the power transistor (14) from a disabling signal. The disabling signal disables the second transistor (23). A second coupling circuit (22) couples a voltage to the first transistor (21) for enabling the first transistor (21) to discharge the input capacitance and disable the power transistor. The second decoupling circuit (22) decouples the gate of the power transistor (14) from a gate of the first transistor (21) as the input capacitance is discharged.

12 Claims, 1 Drawing Sheet

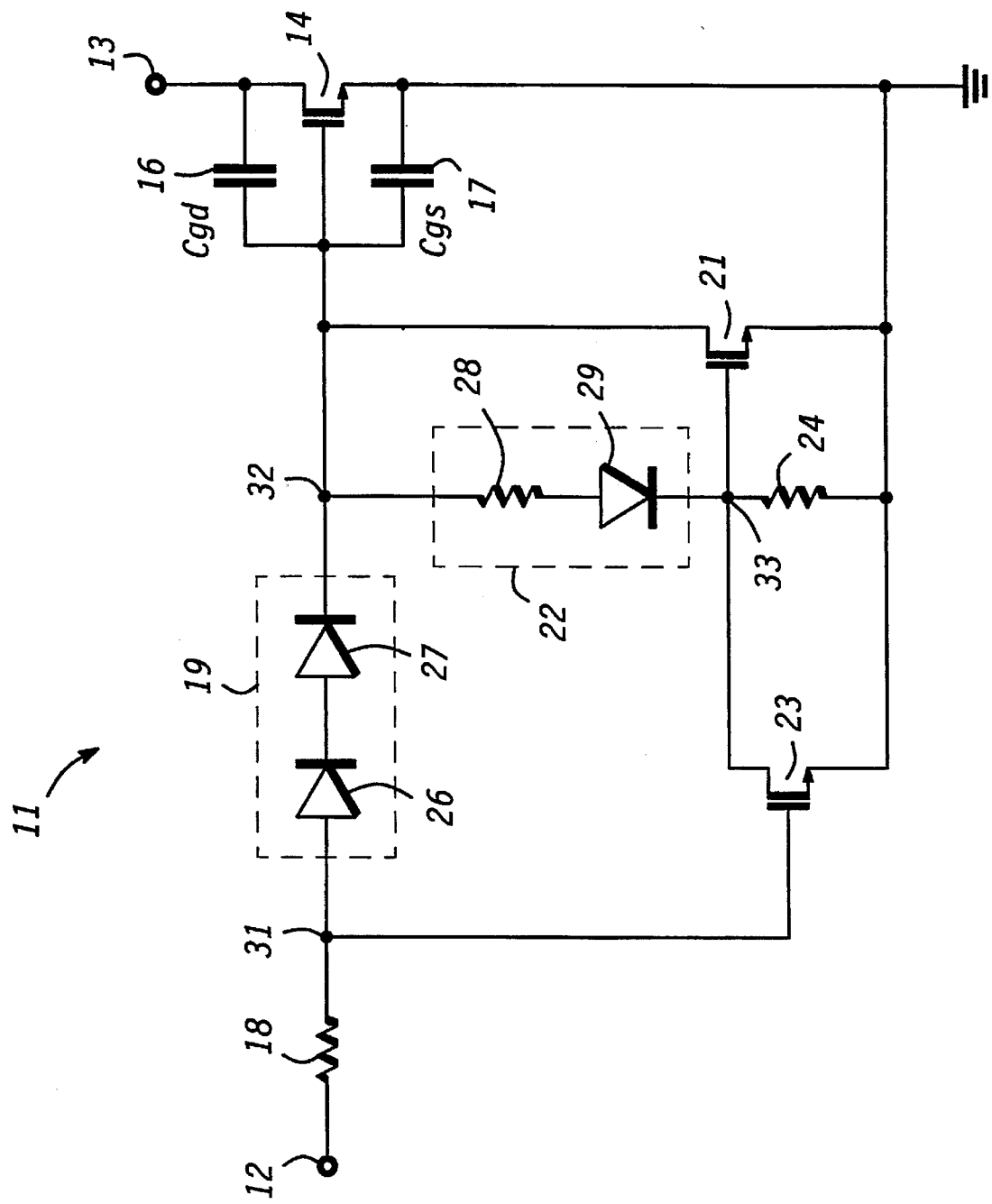

5,467,047

POWER TRANSISTOR RAPID TURN OFF CIRCUIT FOR SAVING POWER

BACKGROUND OF THE INVENTION

This invention relates, in general, to power transistors, and more particularly, to power transistors with turn-off circuitry.

In general, a power transistor is used to drive a capacitive, inductive, or resistive load. A power transistor is used to deliver a current of a magnitude that cannot be provided by other circuitry. For example, an output stage on an integrated circuit may not have a drive capability required for an application. A buffer stage comprising at least one power transistor is coupled to the output stage to increase current drive. The output stage of the integrated circuit acts as a drive circuit for enabling and disabling the power transistor.

The speed at which a power transistor is turned on and off is related to an input capacitance of the power transistor and an output current of a drive circuit. A drive circuit enables and disables a power transistor and often must drive large capacitive loads. For example, an input capacitance of a power transistor such as a power MOSFET (Metal Oxide Semiconductor Field Effect Transistor) typically ranges from 1000–5000 picofarads. The speed at which a power transistor input capacitance is charged and discharged (for turning the power transistor on and off) is a function of a drive circuit output current. Many commonly sold integrated circuits do not have an output current capable of driving an input capacitance of a power transistor at high speeds which reduces power efficiency.

A power transistor is inefficient when operated with a drive circuit that cannot rapidly slew an input capacitance of the power transistor. The inefficiency occurs due to the increased time the power transistor remains on as it transitions from an on state to an off state. A power transistor dissipates power during a transition time period since it remains conducting until it is off. Power efficiency is increased by reducing the transition time period from the on state to the off state.

It would be of great benefit if a circuit could be integrated with a power transistor that substantially decreased the turn-off time of a power transistor thereby increasing power transistor efficiency.

BRIEF DESCRIPTION OF THE DRAWINGS

The sole figure is a schematic diagram of a power transistor with integrated fast turn-off circuitry in accordance with the present invention.

DETAILED DESCRIPTION OF THE DRAWINGS

In general, a power transistor has a large input capacitance that is discharged while turning the device off. The large input capacitance poses a switching speed problem for a drive circuit that is not capable of sinking or sourcing large currents. For example, many output stages commonly found on integrated circuits cannot rapidly switch a 1000–5000 picofarad input capacitance common to power transistors. Furthermore, a slow transition for turning a power transistor from an on state to an off state increases power dissipation by conducting current during an on to off transition time period.

A solution to the aforementioned problems is shown in the sole figure. The sole figure is a schematic diagram of a power transistor 14 with integrated turn-off circuitry. In other words, the turn-off circuitry is integrated on a same semiconductor die as power transistor 14. The devices used to build the turn-off circuitry are easily fabricated in a power transistor wafer process without additional processing steps. The turn-off circuit decreases turn-off time of power transistor 14 by providing an additional device for discharging an input capacitance of power transistor 14. Thus, an output current of a drive circuit is not a sole factor in determining how quickly a power transistor transitions from on to off.

Power transistor 14 includes a drain, gate, and source corresponding respectively to a first electrode, control electrode, and second electrode. Power transistor 14 has the gate coupled to a node 32, the drain coupled to an output 13, and the source coupled to a terminal for receiving a power supply voltage (e.g. ground). Power transistor 14 drives a load (not shown) coupled to output 13. In the preferred embodiment, power transistor 14 is a MOSFET (Metal Oxide Semiconductor Field Effect Transistor) although other types of power transistors such as gallium arsenide power transistors or bipolar power transistors represent a similar turn-off problem. Capacitors Cgd and Cgs are shown to respectively indicate a gate to drain capacitance and a gate to source capacitance of power transistor 14. Capacitors Cgd and Cgs combine to form an input capacitance of power transistor 14 as is well known.

A resistor 18 is coupled between an input 12 and a node 31. Resistor 18 is not integrated with the power transistor but represents a resistance of a drive circuit (not shown) that affects the time period for turning power transistor 14 from an on state to an off state. The input capacitance of power transistor 14 is charged to a voltage applied at input 12 through resistor 18. Resistor 18 and the input capacitance of power transistor 14 have an RC time constant that determines the time to charge the input capacitance. For example, assume resistor 18 has a resistance of 1000 ohms and the input capacitance of power transistor 14 is 1000 picofarads, it will take approximately 4 RC time constants to charge the input capacitance of power transistor 14 to a voltage applied at input 12. Four RC time constants is approximately 4 microseconds. Similarly, without the turn-off circuitry shown in the sole figure it would take approximately 4 RC time constants to discharge the input capacitance of power transistor 14 through resistor 18. A long turn-off time has a substantial impact on power dissipation of power transistor 14.

A coupling circuit 19 couples between node 31 and node 32. Coupling circuit has a first terminal coupled to node 31 and a second terminal coupled to node 32. Coupling circuit 19 allows the input capacitance of power transistor 14 to be charged during an enable cycle but decouples the gate of power transistor 14 from the drive circuit (coupled to input 12) during the disable cycle. In the preferred embodiment, coupling circuit 19 comprises diodes 26 and 27. Diodes 26 and 27 each have an anode and a cathode corresponding respectively to a first terminal and a second terminal. Diode 26 has the anode coupled to node 31. Diode 27 has the anode coupled to the cathode of diode 26 and the cathode coupled to node 32.

A transistor 21 rapidly discharges the input capacitance of transistor 14 during the disable cycle. In the preferred embodiment, transistor 21 is a MOSFET and has a drain, gate, and source corresponding respectively to a first electrode, control electrode, and a second electrode. Transistor 21 includes the gate coupled to a node 33, the drain coupled to node 32, and the source coupled for receiving the power supply voltage (e.g. ground).

A transistor 23 disables transistor 21 when power transistor 14 receives an enabling signal at input 12. In the preferred embodiment, transistor 23 is a MOSFET and has a drain, gate, and source corresponding respectively to a first electrode, control electrode, and a second electrode. Transistor 23 includes the gate coupled to node 31, the drain coupled to node 33, and the source coupled for receiving the power supply voltage (e.g. ground).

A coupling circuit 22 couples between node 32 and node 33. Coupling circuit 22 has a first terminal coupled to node 32 and a second terminal coupled to node 33. Coupling circuit 22 provides a voltage to the gate of transistor 21 during the disable cycle and decouples node 33 from node 32 as node 32 discharges during the disable cycle. In the preferred embodiment, coupling circuit 22 comprises a resistor 28 and a diode 29. Resistor 28 includes a first terminal coupled to node 32 and a second terminal. Diode 29 has an anode and a cathode corresponding respectively to a first terminal and a second terminal. Diode 29 has the anode coupled to the second terminal of resistor 28 and the cathode coupled to node 33. Resistor 24 provides a resistance for discharging the gate capacitance of transistor 21 prior to an enable cycle. Resistor 24 includes a first terminal coupled to node 33 and a second terminal coupled for receiving the power supply voltage (e.g. ground).

Operation of power transistor 14 with integrated fast turn-off circuitry is described hereinafter. An enable cycle is described first. A drive circuit (not shown) couples to input 12 providing a voltage for enabling power transistor 14. The drive circuit provides a current that is coupled through coupling circuit 19 (via diodes 26 and 27) which charges up node 32 (the input capacitance of power transistor 14). Power transistor 14 is enabled when a voltage at node 32 exceeds a threshold voltage of power transistor 14. As mentioned previously, resistor 18 is a resistance of the drive circuit. The time required to charge node 32 can exceed several microseconds depending on the value of resistor 18 and the input capacitance of power transistor 14.

Transistor 23 is also enabled by the voltage applied to input 12. Transistor 23 holds node 33 below a threshold voltage of transistor 21. Transistor 23 receives any current coupled through coupling circuit 22. A current couples through resistor 28 and diode 29 when a voltage at node 32 exceeds a diode voltage drop (approximately 0.70 volts). Transistor 23 has an impedance substantially less than coupling circuit 22 to insure a small voltage from drain to source when enabled. Power transistor 14 remains enabled as long as node 32 remains above its threshold voltage.

A disable cycle begins when the drive circuit (not shown) applies a voltage at input 12. The voltage at input 12 is below the threshold voltages of power transistor 14 and transistor 23. Transistor 23 is disabled by the voltage at input 12. Node 31 is decoupled from node 32 since diodes 26 and 27 are reverse biased. The large input capacitance at node 32 retains the voltage attained during the enable cycle. Node 33 is charged by coupling circuit 22 (transistor 23 is disabled). Transistor 21 is enabled when a voltage at node 33 is greater than the threshold voltage of transistor 21. Transistor 21 has a low impedance and rapidly discharges the input capacitance of power transistor 14. Coupling circuit 22 decouples node 32 from node 33 as the input capacitance of power transistor 14 is discharged. Diode 29 becomes reverse biased when the voltage at node 32 is less than the voltage at node 33 which allows transistor 21 to remain on for turning power transistor 14 off. In the preferred embodiment, resistor 24 discharges node 33 at a rate that allows node 32 to be completely discharged. Resistor 24 insures that transistor 21 is disabled before a new enable cycle begins.

An example illustrating how values for the turn-off circuitry are chosen in conjunction with a power transistor is described hereinafter. A drive circuit having a resistance of 1000 ohms (resistor 18) is coupled to input 12. The drive circuit applies a ten volt signal to enable power transistor 14 and a zero volt signal to disable power transistor 14. In the example, power transistor 14 is a 10 ampere transistor having an input capacitance of 1000 picofarads and operates at a frequency of 20 kilohertz. Power transistor 14 is turned on or off every 50 microseconds.

If only the drive circuit were available to discharge the input capacitance of power transistor 14 it would take approximately 4*(resistor 18)*(input capacitance)=4 microseconds (four RC time constants) to completely discharge the input capacitance. Power transistor 14 would dissipate approximately 600 microjoules of energy when transitioning from an on state to an off state.

Transistor 21 is chosen to be 1/100 of the size of power transistor 14. Transistor 21 sinks a current of approximately 100 milliamperes when enabled. Transistor 21 discharges the input capacitance (1000 picofarads) of power transistor in approximately 100 nanoseconds. Power transistor 14 dissipates approximately 9 microjoules of energy when transitioning from an on state to an off state with the turn-off circuitry which is substantially less than the 600 microjoules dissipated when using the drive circuit alone.

Resistor 28 limits the current charging the gate of transistor 21. Resistor 28 has a resistance of 10 kilo-ohms. The value chosen for resistor 28 is a compromise between the speed at which transistor 21 is turned on, the power dissipated through resistor 28 when power transistor 14 is enabled, and the size of transistor 23 required to disable transistor 21.

An input capacitance of transistor 21 is approximately 10 picofarads (1/100 of the input capacitance of power transistor 14). After transistor 23 is disabled, node 33 charges up through resistor 28 in approximately 4*(resistor 28)*(input capacitance of transistor 21)=400 nanoseconds. Lowering the resistance of transistor 23 increases the speed at which transistor 21 is enabled but increases the power dissipated by resistor 28 and requires transistor 23 to be larger.

The power dissipated by resistor 28 is $V^2/R$ where V is the voltage across resistor 28. If a diode voltage drop is 0.70 volts there is approximately 10 volts−2.1 volts (diodes 26, 27, and 29)=7.9 volts across resistor 28. The power dissipated by resistor 28 is 6.24 milliwatts while power transistor 14 is enabled.

Transistor 23 is chosen having a channel resistance substantially less than 10 kilo-ohms to insure that the voltage at node 33 is near ground when transistor 23 is enabled.

Resistor 24 discharges the input capacitance of transistor 21 after node 32 is decoupled from node 33. Resistor 24 has a resistance substantially larger than resistor 28 to minimize on the voltage at node 33. In this example resistor 24 has a resistance of 500 kilo-ohms which is 50 times greater than resistor 28. Resistor 24 discharges the input capacitance of transistor 21 in approximately 20 microseconds (4*(resistor 24)*(input capacitance of transistor 21)). Resistor 24 is chosen to turn off transistor 21 before power transistor 14 is enabled again. In this example, power transistor operates at 20 kilohertz and switches every 50 microseconds thus resistor 24 has sufficient time to turn off transistor 21.

By now it should be appreciated that a power transistor with integrated turn-off circuitry has been provided. The integrated turn-off circuitry greatly increases the speed at which a power transistor is turned off. Output current provided by a drive circuit is not a main factor in determining turn off time since an additional device is integrated with the power transistor for turning it off. Rapidly turning a power transistor off saves power by reducing the power dissipated while the power transistor transitions from an on state to an off state.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A power device with an integrated turn-off circuit having an input and an output comprising:

a power transistor having a first electrode, a control electrode, and a second electrode, said first electrode being coupled to the output and said second electrode being coupled for receiving a power supply voltage;

a first coupling circuit having a first terminal and a second terminal, said first terminal being coupled to the input and said second terminal being coupled to said control electrode of said power transistor wherein said first coupling circuit couples a first signal to said control electrode of said power transistor for enabling said power transistor during an enable cycle;

a first transistor having a first electrode, a control electrode, and a second electrode, said first electrode of said first transistor being coupled to said control electrode of said power transistor and said second electrode of said first transistor being coupled for receiving said power supply voltage;

a second transistor having a first electrode, a control electrode, and a second electrode, said first electrode of said second transistor being coupled to said control electrode of said first transistor, said control electrode of said second transistor being coupled to the input, and said second electrode of said second transistor being coupled for receiving said power supply voltage; and a second coupling circuit having a first terminal and a second terminal, said first terminal of said second coupling circuit being coupled to said control electrode of said power transistor and said second terminal of said second coupling circuit being coupled to said control electrode of said first transistor wherein said second coupling circuit couples a second signal to said control electrode of said first transistor for enabling said first transistor during a disable cycle.

2. A power device with an integrated turn-off circuit as recited in claim 1 wherein said first coupling circuit decouples said control electrode of said power transistor from the input during said disable cycle.

3. A power device with an integrated turn-off circuit as recited in claim 2 wherein said first coupling circuit comprises:

a first diode having a first terminal and a second terminal, said first terminal of said first diode being coupled to said first terminal of said first coupling circuit; and a second diode having a first terminal and a second terminal, said first terminal of said second diode being coupled to said second terminal of said first diode and said second terminal of said second diode being coupled to said second terminal of said first coupling circuit.

4. A power device with an integrated turn-off circuit as recited in claim 1 wherein said second coupling circuit decouples said control electrode of said power transistor from said control electrode of said first transistor during said disable cycle.

5. A power device with an integrated turn-off circuit as recited in claim 4 wherein said second coupling circuit comprises:

a resistor having a first terminal and a second terminal, said first terminal of said resistor being coupled to said first terminal of said second coupling circuit; and a diode having a first terminal and a second terminal, said first terminal of said diode being coupled to said second terminal of said first resistor and said second terminal of said diode being coupled to said second terminal of said second coupling circuit.

6. A power device with an integrated turn-off circuit as recited in claim 5 wherein an impedance of said second transistor when enabled is substantially less than a resistive value of said second coupling circuit.

7. A power device with an integrated turn-off circuit as recited in claim 6 further including a discharge resistor having a first terminal and a second terminal, said first terminal being coupled to said control electrode of said first transistor and said second terminal being coupled for receiving said power supply voltage.

8. A power device with an integrated turn-off circuit as recited in claim 7 wherein said discharge resistor has a resistive value larger than said resistive value of said resistor of said second coupling circuit.

9. A method for turning a power transistor on and off comprising the steps of:

coupling a signal to a control electrode of the power transistor during an enable cycle wherein said signal charges an input capacitance of the power transistor;

disabling a transistor coupled to said input capacitance of the power transistor during said enable cycle;

decoupling said signal from said control electrode of the power transistor during a disable cycle;

enabling said transistor during said disable cycle wherein charge stored on said input capacitance of the power transistor is coupled to a control electrode of said transistor which enables said transistor for discharging said input capacitance of the power transistor; and decoupling said input capacitance of the power transistor from said control electrode of said transistor prior to said enable cycle.

10. A method as recited in claim 9 further including a step of disabling said transistor after said input capacitance of the power transistor is discharged.

11. A power device with an integrated turn-off circuit having an input and an output comprising:

a power transistor having a first electrode, control electrode, and a second electrode, said first electrode being coupled to the output and said second electrode being coupled for receiving a power supply voltage;

a first diode having a first terminal and a second terminal, said first terminal coupled to the input and said second terminal coupled to said control electrode of said power transistor;

a first transistor having a first electrode, a control electrode, and a second electrode, said first electrode of said first transistor being coupled to said control electrode of said power transistor and said second electrode of said first transistor being coupled for receiving said power supply voltage;

a second transistor having a first electrode, a control electrode, and a second electrode, said first electrode of said second transistor being coupled to said control electrode of said first transistor, said control electrode of said second transistor being coupled to the input, and said second electrode of said second transistor being coupled for receiving said power supply voltage; and a first resistor having a first terminal and a second terminal, said first terminal of said first resistor being coupled to said control electrode of said power transistor; and a second diode having a first terminal and a second terminal, said first terminal of said second diode being coupled to said second terminal of said first resistor and said second terminal of said second diode being coupled to said control electrode of said first transistor.

12. A power device with an integrated turn-off circuit as recited in claim 11 further including a second resistor having a first terminal and a second terminal, said first terminal of said second resistor being coupled to said control electrode of said first transistor and said second terminal of said second resistor being coupled for receiving said power supply voltage.

* * * * *

UNITED STATES PATENT AND TRADEMARK OFFICE
CERTIFICATE OF CORRECTION

PATENT NO. : 5,467,047
DATED : November 14, 1995
INVENTOR(S) : Stephen P. Robb

It is certified that error appears in the above-indentified patent and that said Letters Patent is hereby corrected as shown below:

In column 6, line 18, claim 6, delete "substantially".

In column 6, line 19, claim 6, insert --of said resistor-- after "value".

Signed and Sealed this

Twenty-seventh Day of May, 1997

Attest:

BRUCE LEHMAN

Attesting Officer    Commissioner of Patents and Trademarks